(12) United States Patent
Hoshi et al.

(10) Patent No.: US 9,111,883 B2
(45) Date of Patent: Aug. 18, 2015

(54) METHOD FOR EVALUATING SILICON SINGLE CRYSTAL AND METHOD FOR MANUFACTURING SILICON SINGLE CRYSTAL

(71) Applicant: SHIN-ETSU HANDOTAI CO., LTD., Tokyo (JP)

(72) Inventors: Ryoji Hoshi, Nishigo-mura (JP); Hiroyuki Kamada, Nishigo-mura (JP); Suguru Matsumoto, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/358,618

(22) PCT Filed: Nov. 12, 2012

(86) PCT No.: PCT/JP2012/007232
§ 371 (c)(1),
(2) Date: May 15, 2014

(87) PCT Pub. No.: WO2013/084410
PCT Pub. Date: Jun. 13, 2013

(65) Prior Publication Data
US 2014/0363904 A1    Dec. 11, 2014

(30) Foreign Application Priority Data
Dec. 6, 2011 (JP) ................................. 2011-266877

(51) Int. Cl.
*H01L 21/322* (2006.01)
*C30B 29/06* (2006.01)
(Continued)

(52) U.S. Cl.
CPC ............ *H01L 21/3225* (2013.01); *C30B 15/00* (2013.01); *C30B 29/06* (2013.01); *C30B 33/02* (2013.01); *H01L 22/12* (2013.01)

(58) Field of Classification Search
CPC ........................................................ C30B 15/206
USPC ................................................ 438/14; 702/23
See application file for complete search history.

(56) References Cited

U.S. PATENT DOCUMENTS 7,521,382 B2 * 4/2009 Falster et al. ................. 438/795
8,263,484 B2 * 9/2012 Kurita ........................... 438/530
(Continued)

FOREIGN PATENT DOCUMENTS

JP    A-05-155682    6/1993
JP    A-2005-123351  5/2005
(Continued)

OTHER PUBLICATIONS

Feb. 19, 2013 International Search Report issued in International Application No. PCT/JP2012/007232.
(Continued)

*Primary Examiner* — Yu-Hsi D Sun
*Assistant Examiner* — Chi-Hua Yang
(74) *Attorney, Agent, or Firm* — Oliff PLC

(57) ABSTRACT

The present invention provides a method for evaluating silicon single crystal wherein an amount $\Delta[C]$ of carriers generated due to oxygen donors produced when a heat treatment is performed to the silicon single crystal is calculated and evaluated, the amount $\Delta[C]$ being calculated from oxygen concentration [Oi] in the silicon single crystal, a temperature T of the heat treatment, a time t of the heat treatment, and an oxygen diffusion coefficient D(T) at the temperature T by using the following relational expression:

$$\Delta[C] = \alpha[Oi]^5 \times \exp(-\beta \cdot D(T) \cdot [Oi] \cdot t)$$

(where $\alpha$ and $\beta$ are constants). As a result, there is provided a method that enables evaluating an amount of carriers generated due to oxygen donors in silicon single crystal in a further versatile manner.

6 Claims, 5 Drawing Sheets

(51) Int. Cl.
*C30B 15/00* (2006.01)
*C30B 33/02* (2006.01)
*H01L 21/66* (2006.01)

(56) References Cited

U.S. PATENT DOCUMENTS

| | | | |
|---|---|---|---|
| 8,571,812 B2 * | 10/2013 | Veirman et al. | 702/32 |
| 2005/0127477 A1 | 6/2005 | Takase et al. | |
| 2007/0066033 A1 | 3/2007 | Kurita et al. | |
| 2009/0210166 A1 * | 8/2009 | Nakamura et al. | 702/23 |
| 2010/0075267 A1 * | 3/2010 | Sadohara et al. | 432/1 |
| 2014/0033797 A1 * | 2/2014 | Veirman et al. | 73/31.06 |

FOREIGN PATENT DOCUMENTS

| | | |
|---|---|---|
| JP | A-2005-294694 | 10/2005 |
| WO | WO 2005/038899 A1 | 4/2005 |
| WO | WO 2005/071144 A1 | 8/2005 |

OTHER PUBLICATIONS

Wada et al., "Oxide Precipitate Nucleation in Czochralski Silicon—An Insight From Thermal Donor Formation Kinetics," *Semiconductor Silicon*, 1986, pp. 778-789.

Takeno et al., "Diffusivity of oxygen in Czochralski silicon at 400-750°C," *Journal of Applied Physics*, Sep. 15, 1998, vol. 84, No. 6, pp. 3113-3117.

Kaiser et al., "Mechanism of the Formation of Donor States in Heat-Treated Silicon," *Physical Review*, Dec. 1, 1958, vol. 112, No. 5, pp. 1546-1554.

* cited by examiner

METHOD FOR EVALUATING SILICON SINGLE CRYSTAL AND METHOD FOR MANUFACTURING SILICON SINGLE CRYSTAL

TECHNICAL FIELD

The present invention relates to a method for evaluating silicon single crystal and a method for manufacturing silicon single crystal, and more particularly to a method for evaluating silicon single crystal containing oxygen grown by a Czochralski method (a CZ method), a magnetic field applied Czochralski method (an MCZ method), or the like and a method for manufacturing the same.

BACKGROUND ART

In mobile communications as typified by a mobile phone or the like, low costs, high integration, low power, multifunction, speed improvement, and others evolve day by day. So-called RF (radio frequency) devices are used in these aspects. A compound semiconductor is exclusively used for such RF devices.

However, in recent years, since a CMOS process has been finer or a reduction in cost is desired, an RF device based on silicon has become feasible.

In an RF device using a silicon single crystal wafer, when a substrate resistivity is low, loss is high because of high conductivity, and a high resistivity is used. Although a wafer having a thin oxide film and a thin silicon layer formed on a silicon substrate surface layer portion, called an SOI (Silicon on Insulator), may be used, a high resistivity is likewise desired in this case.

However, when a high-resistivity substrate of crystal grown by the CZ method is used, there occurs a problem that oxygen atoms that are present in CZ crystal form oxygen donors by a heat treatment at a relative low temperature for wiring or packaging which is a post-process of a device and thereby a resistivity of the substrate shifts.

In Patent Literature 1 or Patent Literature 2, there is suggested a method for outwardly diffusing oxygen atoms by performing a high-temperature heat treatment, thereby lowering concentration near the surface of the substrate where a device is formed.

However, according to this method, there is a problem that a high-temperature heat treatment process is required and hence costs are increased.

Thus, lowering oxygen concentration in crystal that is grown by the CZ method is considered to be preferable. Patent Literature 3 discloses an oxygen reducing technology, and considerably low oxygen concentration is achieved. However, as described in Patent Literature 3 or the like, a top side (a head side) of crystal generally has high oxygen concentration, lowering this concentration is difficult, and hence an good chip yield is decreased as the target oxygen concentration that should be achieved becomes lower.

Furthermore, when the target oxygen concentration is extremely low, material melt in the crucible starts to be solidified and dislocation of crystal occurs in some cases. Therefore, if the considerably low oxygen concentration is aimed, there occurs a problem that costs increase in the end.

Patent Literature 4 discloses a method for obtaining an amount of oxygen donors generated in high-resistivity crystal. Here, it is assumed that the amount of the generated oxygen donors is proportionate to the Bth power of the oxygen concentration (see paragraph 40 in Patent Literature 4), but a specific numerical value is not eventually revealed.

Moreover, FIG. 2 of Patent Literature 4 shows that the oxygen concentration and the amount of the generated oxygen donors have a relationship that is expressed by a straight line on a semilogarithmic graph. If the amount of the generated oxygen donors is proportionate to the Bth power of the oxygen concentration, the straight line relationship on the semilogarithmic graph cannot be obtained, the amount of the generated oxygen donors is not represented as a mathematical expression by this method after all, and hence it can be considered that general versatility is not provided.

CITATION LIST

Patent Literature

Patent Literature 1: Japanese Unexamined Patent Application Publication (Kokai) No. 2005-123351
Patent Literature 2: International Publication No. WO 2005/038899
Patent Literature 3: Japanese Unexamined Patent Application Publication (Kokai) No. Hei 5-155682
Patent Literature 4: Japanese Unexamined Patent Application Publication (Kokai) No. 2005-294694

DISCLOSURE OF INVENTION

Problem to be Solved by the Invention

Thus, to provide the general versatility, it is important to represent, e.g., an amount of generated oxygen donors using a numerical expression.

Here, oxygen donors and the like are described in International Publication No. WO 2005/071144, Non-patent Literature W. Kaiser et al., Phys. Rev. 112, 1546 (1958) or K. wada et al., in Semiconductor Silicon/1986 edited by H. R. Huff at al. (Electrochemical Society, Pennington N.J., 1986), p. 778 or H. Takeno et al., J. Appl. Phys. 84, 3117 (1998), and others, and the present inventors tried digitizing concentration of carriers produced due to oxygen donors based on these descriptions.

A conclusion derived from these literatures is that concentration $\Delta[C]$ of carriers produced due to oxygen donors generated by a heat treatment is represented as follows:

$$\Delta[C]=\alpha'[Oi]^3 \times \exp(-\beta' \cdot D(T) \cdot [Oi] \cdot t)$$

(where $\alpha'$ and $\beta'$ are constants). It is to be noted that [Oi] is oxygen concentration in silicon single crystal, T is a temperature of the heat treatment, t is a time of the heat treatment, and D(T) is an oxygen diffusion coefficient at the temperature T.

Further, as a result of obtaining the coefficients $\alpha'$ and $\beta'$ in this relational expression and checking an amount of carriers generated due to oxygen donors, it was revealed that lower oxygen concentration in the silicon single crystal as an evaluation target deviates from a relationship based on this relational expression. That is, it was found out that an amount of carriers generated due to oxygen donors with low oxygen concentration cannot be obtained from the above-described relational expression.

Thus, in view of the above-described problems, it is an object of the present invention to provide a method that enables evaluating an amount of carriers generated due to oxygen donors in silicon single crystal in a further versatile manner.

Furthermore, it is also an object of the present invention to provide a method for growing and manufacturing silicon single crystal that can have a desired resistivity even though oxygen donors are generated and a resistivity of a substrate shifts.

Means for Solving Problem

To achieve this object, the present invention provides a method for evaluating silicon single crystal wherein an amount $\Delta[C]$ of carriers generated due to oxygen donors produced when a heat treatment is performed to the silicon single crystal is calculated and evaluated, the amount $\Delta[C]$ being calculated from oxygen concentration [Oi] in the silicon single crystal, a temperature T of the heat treatment, a time t of the heat treatment, and an oxygen diffusion coefficient D(T) at the temperature T by using the following relational expression:

$$\Delta[C]=\alpha[Oi]^5 \times \exp(-\beta \cdot D(T) \cdot [Oi] \cdot t)$$

(where $\alpha$ and $\beta$ are constants).

According to such an evaluation method, it is possible to highly accurately obtain an amount of carrier concentration produced due to oxygen donors not only in a case where oxygen concentration is high in the silicon single crystal as an evaluation target but also in a case where the oxygen concentration is low, thereby enabling the evaluation in a more versatile manner.

It is to be noted that the heat treatment mentioned here is a heat treatment at a temperature of approximately 450° C. that enables easily generating oxygen donors, and it can be a heat treatment at a relatively low temperature of, e.g., approximately 400 to 500° C.

At this time, it is possible that the oxygen concentration in the silicon single crystal to be evaluated is set to $9 \times 10^{17}$ atoms/cm$^3$ (ASTM' 79) or less.

As described above, it is possible to adopt as an evaluation target the silicon single crystal with low oxygen concentration that is hardly considered in the prior art. Moreover, the evaluation can be conducted with a high accuracy.

Additionally, it is possible that an amount of carriers generated due to oxygen donors is calculated by using the relational expression, and a resistivity of the silicon single crystal after the heat treatment is calculated by using the calculated amount of carriers generated and is evaluated.

According to such an evaluation method, when the oxygen donors are formed by the heat treatment and the resistivity of the silicon single crystal substrate is shifted, it is possible to appropriately perform the evaluation to check whether, for example, the resistivity of the silicon single crystal meets the standard after the heat treatment.

Additionally, the present invention provides a method for manufacturing silicon single crystal wherein a resistivity of the silicon single crystal after the heat treatment is calculated by using the above-described method for evaluating silicon single crystal, target values of oxygen concentration and a resistivity at the time of growing the silicon single crystal are determined based on the calculated resistivity, and the silicon single crystal is grown based on the determined target values.

According to such a manufacturing method, even if a heat treatment is performed at a relatively low temperature at wiring or packaging, the silicon single crystal can be grown based on the amount of carriers generated due to oxygen donors produced by the heat treatment and a resultant shift of the resistivity. Therefore, the resistivity after the shift can coincide with a target value even though the oxygen donors are generated after the heat treatment and the resistivity is shifted, thus enabling obtaining a desired product. Further, generation of an operation failure or the like in a device can be suppressed.

Effect of the Invention

As described above, the method for evaluating silicon single crystal according to the present invention can be extensively applied to not only silicon single crystal of high oxygen concentration but also the same of low oxygen concentration, the versatility can be enhanced, and the evaluation can be highly accurately performed as compared with conventional examples.

Furthermore, the method for manufacturing silicon single crystal according to the present invention enables growing and manufacturing the silicon single crystal while considering an amount of carriers generated due to oxygen donors by the heat treatment, and hence a product having a desired resistivity can be finally obtained.

BEST MODE(S) FOR CARRYING OUT THE INVENTION

Although a method for evaluating silicon single crystal and a method for manufacturing the same according to the present invention will now be described in detail hereinafter as an embodiment with reference to the drawings, the present invention is not restricted thereto.

First, a method for evaluating silicon single crystal according to the present invention will be explained.

Figure 1:
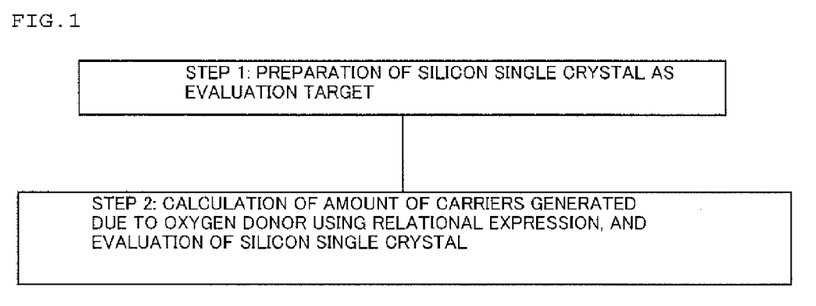
FIG. 1 is a flowchart showing an example of a method for evaluating silicon single crystal according to the present invention.

FIG. 1 is a flowchart showing an example of a procedure of this method.

(Step 1) Preparation of Silicon Single Crystal as Evaluation Target

Silicon single crystal that is an evaluation target is prepared.

In this method, since an amount of carriers generated due to oxygen donors is obtained, silicon single crystal containing oxygen can be used in particular. For example, silicon single crystal based on the CZ method or the MCZ method can be prepared.

First, the silicon single crystal is grown.

Here, an apparatus that can grow the silicon single crystal based on the CZ method or the like will be explained with reference to FIG. 2.

Figure 2:
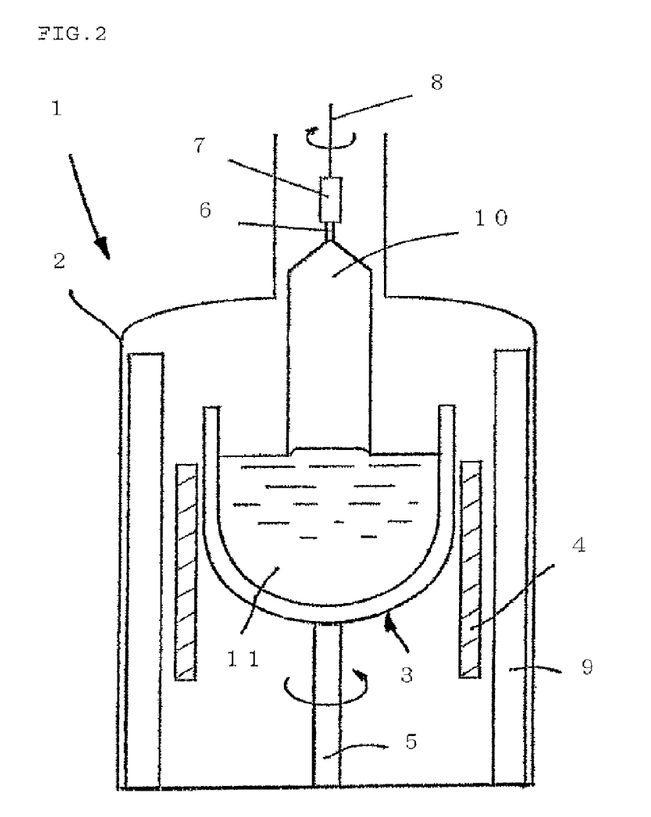
FIG. 2 is a schematic view showing an example of an apparatus that is used for growing the silicon single crystal based on a CZ method.

As shown in FIG. 2, a single-crystal pulling apparatus 1 is constituted of a pulling chamber 2, a crucible 3 provided in the pulling chamber 2 (a quartz crucible on the inner side, a graphite crucible on the outer side), a heater 4 arranged around the crucible 3, a crucible holding shaft 5 and a rotary mechanism (not shown) thereof that rotate the crucible 3, a seed chuck 7 that holds seed crystal 6 of silicon, a wire 8 that pulls the seed chuck 7, and a take-up mechanism (not shown) that rotates or takes up the wire 8. Moreover, an insulating material 9 is arranged around the outer side of the heater 4.

The silicon single crystal 10 is pulled from a silicon melt 11 of a raw material with the use of the wire 8.

In case of growing the silicon single crystal 10 by using such a single-crystal pulling apparatus 1 shown in FIG. 2, the seed crystal 6 held by the seed chuck 7 is immersed in the silicon melt 11 in the crucible 3 while rotating the crucible 3. Additionally, the rod-like silicon single crystal 10 is pulled from the silicon melt 11 while rotating/taking up the wire 8.

The crucible 3 can be moved up and down in a crystal growth axis direction by the crucible holding shaft 5, and the crucible 3 is moved up so as to compensate the lowering of a liquid level of the melt that is crystallized and reduced during the crystal growth. On a lateral side of the crystal, an inert gas is allowed to flow in order to adjust a flow of oxidizing vapor produced from the silicon melt 11.

Since the quartz crucible having the silicon melt 11 therein is made of silicon and oxygen, oxygen atoms are eluted into the silicon melt. The oxygen atoms move on convection or the like in the silicon melt 11, and they are eventually evaporated from a surface of the melt. At this time, most of the oxygen atoms are evaporated, but part of oxygen is taken into crystal to turn to interstitial oxygen Oi.

At this time, when the number of rotations of the crucible 3 or the silicon single crystal 10 to be grown is changed or magnetic field applying conditions are changed in a magnetic field applied CZ method (namely, the MCZ method), a flow of the convection in the silicon melt 11 can be controlled to control oxygen concentration in the crystal, and an amount of oxygen evaporated from the surface can be controlled by adjustment of a flow rate of the inert gas or control over a pressure in a furnace.

It is to be noted that growing the silicon single crystal having oxygen concentration of $10 \times 10^{17}$ atoms/cm$^3$ (ASTM' 79) or less based on the CZ method is difficult, the MCZ method can be used. It is also possible to use the CZ method or the MCZ method in accordance with a target value of the oxygen concentration.

As described above, the silicon single crystal can be grown while adjusting the oxygen concentration. Additionally, a wafer-shaped sample is sliced out from the obtained silicon single crystal by using a band saw or the like.

It is to be noted that the oxygen concentration can be obtained with the use of this wafer-shaped sample based on, e.g., an FT-IR method at a room temperature. Here, in the oxygen concentration [Oi], Oi is written since each oxygen atom is present at an interstitial position in the silicon crystal and infrared absorption is measured at this position to be represented as the oxygen concentration.

The oxygen concentration of the silicon single crystal as an evaluation target is not restricted in particular, and it can be appropriately determined in accordance with, e.g., an object of the evaluation.

It is to be noted that the present invention method is particularly useful with respect to low-oxygen crystal having the oxygen concentration of $9 \times 10^{17}$ atoms/cm$^3$ (ASTM' 79) or less.

Then, an oxygen donor annihilation heat treatment is performed with respect to the sample.

The oxygen donors are present in the crystal after the silicon single crystal growth. The oxygen donors are generated in a relatively low-temperature region of approximately 450° C. Such a low-temperature thermal history is not applied to a bottom side (a tail side: a portion that is grown later) of the crystal during the crystal growth, consequently the oxygen donors are hardly generated on the bottom side. Contrarily, this low-temperature heat history is sufficiently applied to a top side (a head side: a portion that is grown first) of the crystal, and hence many oxygen donors are generated on the top side.

With recent elongation of crystal, this tendency is further prominent, large quantities of oxygen donors are present on the top side, but the oxygen donors are hardly present on the bottom side.

It is known that the oxygen donor is annihilated by performing, e.g., a minor heat treatment at 650° C. for approximately 20 minutes. Besides, various donor annihilation heat treatments are suggested, there is a high-temperature short-time treatment using, e.g., RTA (Rapid Thermal Anneal), a temperature and a time are not specified in particular here, a method that can annihilate thermal donors generated due to oxygen can suffice, and hence a heat treatment performed at 650° C. for 20 minutes is adopted.

After performing the oxygen donor annihilation heat treatment, a PN determination is made, and then a resistivity is measured by using, e.g., a four point probe method. A method for measuring a resistivity is not restricted in particular, and an appropriate method can be selected.

Further, carrier concentration is obtained from the measured resistivity by using an Irvin curve.

As described above, the sample of the silicon single crystal as an evaluation target is prepared, oxygen concentration, carrier concentration, a resistivity, and others are examined in advance.

(Step 2) Calculation of Amount of Carriers Generated Due to Oxygen Donors Using Relational Expression and Evaluation of Silicon Single Crystal Then, a relational expression:

$$\Delta[C] = \alpha[Oi]^5 \times \exp(-\beta \cdot D(T) \cdot [Oi]t)$$

(where $\alpha$ and $\beta$ are constants) is used to calculate the amount of carriers generated due to the oxygen donors.

In the relational expression, [Oi] is the oxygen concentration in the silicon single crystal, T is a temperature of the heat treatment, t is a time of the heat treatment, and D(T) is an oxygen diffusion coefficient at the temperature T.

It is to be noted that the oxygen concentration [Oi] in the silicon single crystal in the relational expression is oxygen concentration obtained based on the FT-IR method or the like at Step 1.

Further, the temperature T of the heat treatment can be appropriately determined in accordance with an object and the like. For example, in case of obtaining the amount of carriers generated due to the oxygen donors by the heat treatment performed in a process for wiring or packaging after a device process, the same value as that actually obtained in this process can be used. Heat treatment conditions that enable generating the oxygen donors can suffice. For example, a heat treatment temperature of approximately 400 to 500° can be used.

The heat treatment time t can be appropriately determined in the same manner.

Further, the constants $\alpha$ and $\beta$ are constants that can be determined under respective measurement conditions.

For example, although the oxygen concentration is measured by the FT-IR, absorbance obtained by subtracting a reference from an absorption peak is converted into the oxygen concentration. At this time, a conversion factor differs depending on a reference, differs depending on a measuring instrument, and also differs depending on a measuring instrument manufacturer. Therefore, even if the same sample is measured, a result varies depending on a conversion factor adopted. Furthermore, a measuring instrument manufacturer displays the oxygen concentration in ppma, and another measuring instrument manufacturer displays the same in atoms/$cm^3$.

Under the above-described circumstances, $\alpha$ and $\beta$ differ depending on each measuring instrument manufacturer. However, when the conditions for measuring the oxygen concentration are matched, the same numerical figures can be used, and hence the versatility can be provided if these values are once determined. Moreover, there is almost no difference in resistivity measurement between the measuring instrument manufacturers, a difference between oxygen concentration conversion factors alone affects $\alpha$ and $\beta$. Therefore, for example, if the oxygen concentration conversion factors as a condition A and a condition B are 1.6 and represented as [Oi] (the condition A)=1.6×[Oi] (the condition B), constants can be converted based on a (the condition B)=$\alpha$ (the condition A)/($1.6^5$), $\beta$ (the condition B)=$\beta$ (the condition A)/1.6.

It is not that a method for calculating an amount of carriers generated due to oxygen donors was not present in the past, and if each appropriate factor is obtained as described above, the method in the past seems proper in a range of the oxygen concentration, e.g., which has been often used in the prior art, higher than the range of $9\times10^{17}$ atoms/$cm^3$ (ASTM' 79).

However, as described above, an amount of carriers generated cannot be represented well with respect to the oxygen concentration that is equal to or less than $9\times10^{17}$ atoms/$cm^3$ (ASTM' 79) that has been often used in recent years.

However, the present invention method can be extensively applied to low-oxygen concentration crystal that is becoming increasingly common in recent years to conventional oxygen concentration crystal. Therefore, the present invention method enables easily obtaining an amount of donors generated in the all oxygen concentration and enhancing versatility.

Experiments 1 to 3 conducted by the present inventors who derived the relational expression according to the present invention will now be described.
(Experiment 1)
First, the relational expression $$\Delta[C]=\alpha'[Oi]^3 \times \exp(-\beta' \cdot D(T) \cdot [Oi] \cdot t)$$

(where $\alpha'$ and $\beta'$ are constants) derived from International Publication No. WO 2005/071144 and the like described above will be examined.

Like Step 1, P-type crystal having oxygen concentration distributed thereto is grown by using the CZ method and the MCZ method, and wafer-shaped samples were sliced out from this grown crystal.

Samples having the oxygen concentrations [Oi]=$9.2\times10^{17}$, $10.8\times10^{17}$, $12.8\times10^{17}$, $13.8\times10^{17}$, and $15.9\times10^{17}$ atoms/$cm^3$ (ASTM' 79) were prepared.

Then, each sample was subjected to a donor killer heat treatment, then a PN determination and measurement of a resistivity. Subsequently, samples were divided into two groups and subjected to a heat treatment at 450° facilitating generation of oxygen donors on two levels, i.e., one hour (3600 seconds) and 15 hours (54000 seconds), respectively. Each sample was again subjected to the PN determination and the measurement of a resistivity. Carrier concentration was obtained from an Irvin curve based on the resistivity.

Figure 9:
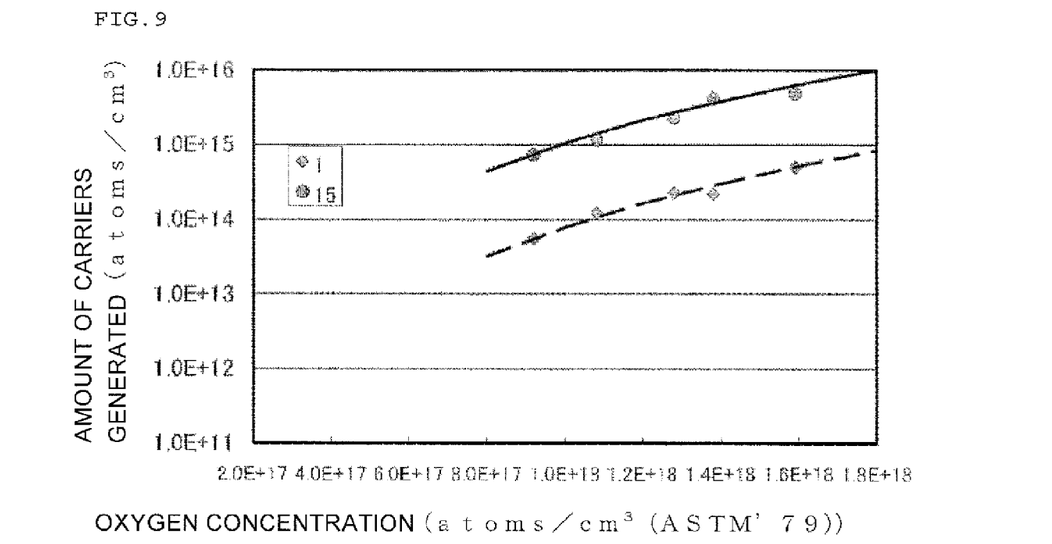
FIG. 9 is a graph showing a relationship between oxygen concentration and an amount of carriers generated in Experiment 1 and a relational expression according to a prior art.

Since the P-type samples were used this time, an amount of carriers generated due to oxygen donors was obtained by subtracting the carrier concentration after the heat treatment from the carrier concentration before the heat treatment. However, in regards a sample that was reversed to an N type after the heat treatment, a sum of the carrier concentration before the heat treatment and the carrier concentration after the heat treatment was determined as the amount of carriers generated due to the oxygen donors. In FIG. 9, these amounts $\Delta[C]$ of carriers generated were plotted with respect to the oxygen concentration [Oi].

In contrast to this, a line in FIG. 9 is obtained by fitting the coefficients $\alpha'$ and $\beta'$ in $\Delta[C]=\alpha'[Oi]^3 \times \exp(-\beta' \cdot D(T) \cdot [Oi] \cdot t)$ derived from the reference. As a result of fitting, $\alpha'=4.53\times10^{-39}$ and $\beta'=1.63\times10^5$ were obtained. At this time, a diffusion coefficient D(T) of oxygen was calculated based on $D(T)=Do\times\exp(-E/kT)$, Do=0.13 $cm^2$/sec, and E=2.53 eV. That is, the relational expression becomes the following Expression (1). Further, each unit is as follows.

$$\Delta[C]=4.53\times10^{-39}\times[Oi]^3\times\exp(-1.63\times10^{-5}\times D(T)\cdot [Oi]\cdot t) \quad \text{Expression (1)}$$

[Oi]: oxygen concentration (atoms/$cm^3$ (ASTM' 79)), T: heat treatment temperature (K), t: heat treatment time (sec), D(T): oxygen diffusion coefficient ($cm^2$/sec) at the temperature T, and k: Boltzmann's constant=$8.62\times10^{-5}$ (eV/K)

The thus obtained Expression (1) in case of 450° C. and one hour was represented as a broken line in FIG. 9, and a counterpart in case of 450° C. and 15 hours was represented as a solid line in FIG. 9. As a result, the lines excellently coincide with experimental values, and Expression (1) seems correct.
(Experiment 2)

Subsequently, whether Expression (1) could be used even in an extended lower oxygen concentration region was confirmed.

Like Experiment 1, samples each having oxygen concentration distributed thereto were prepared. However, oxygen levels are lower than those in Experiment 1, and they are $4.8\times10^{17}$, $5.2\times10^{17}$, $5.8\times10^{17}$, $6.8\times10^{17}$, and $8.0\times10^{17}$ atoms/cm3 (ASTM' 79). Since the oxygen concentration must be lowered, the samples used here were all fabricated by using the MCZ method with a magnetic field applied.

Figure 10:
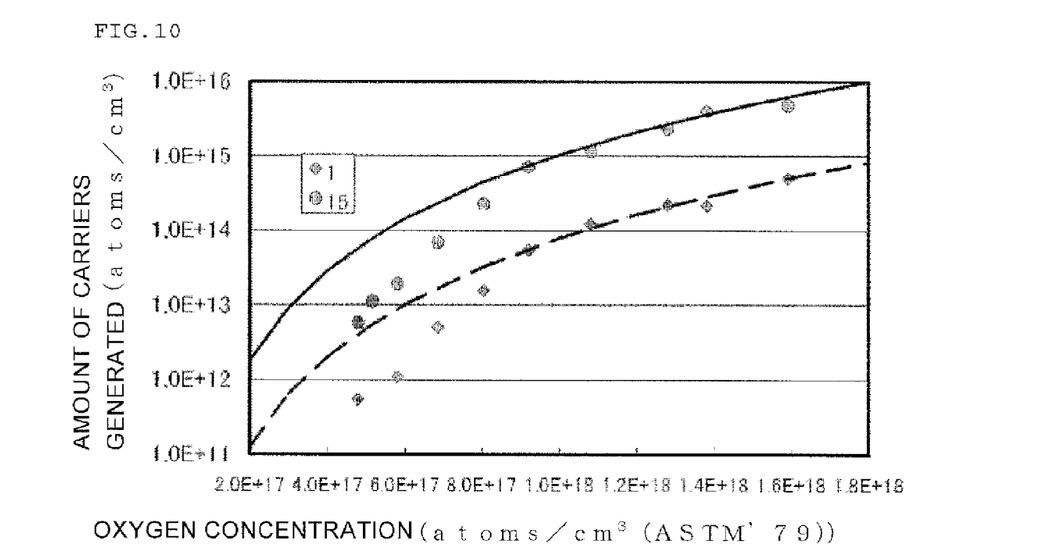
FIG. 10 is a graph showing a relationship between oxygen concentration and an amount of carriers generated in Experiment 2 and a relational expression according to a prior art.

These samples were subjected to the donor killer heat treatment, then the PN determination and the measurement of a resistivity. Subsequently, the heat treatment was carried out at 450° C. for one hour and for 15 hours, and the PN determination and the measurement of a resistivity were again performed in a completely the same manner as Experiment 1. Based on obtained results, an amount of carriers generated due to oxygen donors was obtained and plotted in FIG. 10 with the results in Experiment 1. Each of a broken line and a solid line shown in FIG. 10 is a line representing Expression (1).

It can be understood that the oxygen concentration of $9 \times 10^{17}$ atoms/cm³ (ASTM' 79) is on the borderline, experimental values and Expression (1) excellently coincide with each other in a higher oxygen concentration region than the borderline, but they do not coincide with each other in a lower oxygen concentration region. It can be considered that the reason why this mismatch is observed is because all the reference literatures are relatively old, the MCZ method has not greatly spread, or the oxygen concentration that is a feature of CZ crystal and provides a gettering effect did not have to be reduced in the first place, and hence there were not many samples with such low-oxygen concentration.

Furthermore, a fact that a thermal donor functions as a nucleus of oxygen precipitation is reported in the reference literatures, the thermal donor grows into an oxide precipitate in this high-oxygen concentration region, and hence an accurate description was not prepared. In any case, it can be considered that there is no inconvenience in Expression (1) as long as the conventional oxygen concentration is used.
(Experiment 3)

However, using MCZ crystal in a low-oxygen concentration region that was not observed in the prior art can be expected, and hence an expression that can also represent a low-oxygen concentration side is preferable. Thus, an expression that substitutes for Expression (1) and enables obtaining an amount of carriers generated due to oxygen donors was keenly examined based on these pieces of data.

As a result, it was revealed that the following expression can be used with respect to the silicon single crystal in each of Experiments 1 and 2.

$$\Delta[C]=5.78\times10^{-74}\times[Oi]^5\times\exp(-6.25\times10^{-7}\times D(T)\cdot[Oi]\cdot t) \quad \text{Expression (2)}$$

Specifically, on the low-oxygen concentration side in FIG. 10, experimental results (points) do not coincide with $\Delta[C]=4.53\times10^{-39}\times[Oi]^3\times\exp(-1.63\times10^{-5}\times D(T)\cdot[Oi]\cdot t)$ (a line) of Expression (1) obtained in the experiment 1. When the oxygen concentration becomes lowered, the experimental values rapidly become smaller than Expression (1). Therefore, it is assumed that an influence degree of the oxygen concentration (which is proportionate to $[Oi]^3$) provided by Expression (1) is low, and an influence of the oxygen concentration is higher in reality.

Thus, fitting was carried out on the assumption that amounts of carriers generated are proportionate to the fourth power, the fifth power, and the sixth power of the oxygen concentration [Oi], respectively, and the best matching was observed when it was assumed that the amount of carriers generated is proportionate to the fifth power of the oxygen concentration. The coefficients α and β obtained at this time correspond to Expression (2).

Here, a diffusion coefficient and a unit system are the same as those in the experiment 1, $D(T)=0.13\times\exp(-2.53/kT)$ (cm²/sec) is achieved, and [Oi]: oxygen concentration (atoms/cm³ (ASTM' 79)), T: a heat treatment temperature (K), t: a heat treatment time (sec), and k: a Boltzmann's constant=$8.62\times10^{-5}$ (eV/K) are used.

A significant point of characteristics of this Expression (2) lies in that a portion that is proportionate to the third power of the oxygen concentration [Oi] in the prior art is proportionate to the fifth power. This means that it has been considered that three or four oxygen atoms are used to form an oxygen donor in the prior art, but more oxygen atoms are actually used to form the oxygen donor. This is the point that has been revealed by an evaluation of the oxygen concentration region lower than that in the prior art.

Figure 3:
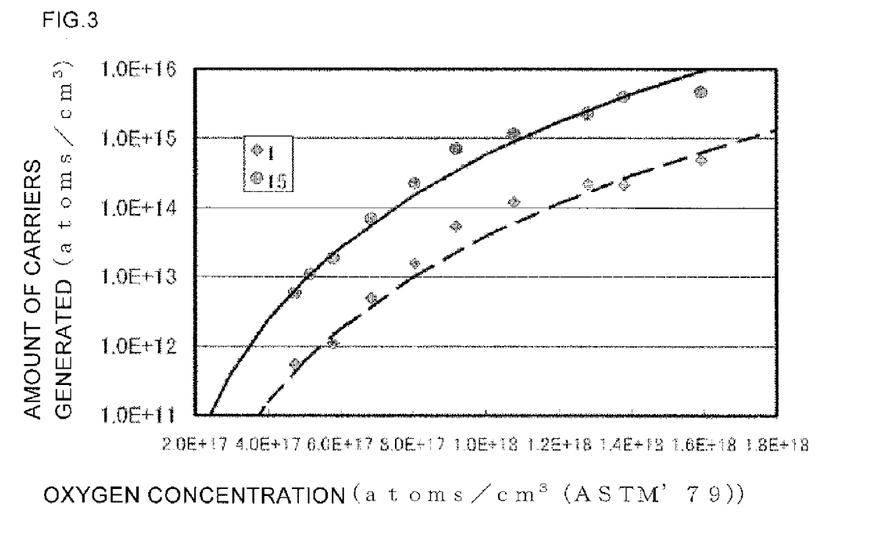
FIG. 3 is a graph showing a relationship between oxygen concentration and an amount of carriers generated in Experiment 3 and a relational expression according to the present invention.

FIG. 3 is a graph showing Expression (2) and results of the experiment 1 and the experiment 2. The experimental results can be excellently represented in the entire oxygen concentration region. From the above, it can be considered that obtaining the amount of carriers generated due to the oxygen donors from Expression (2) is proper.

The relational expression in the present invention was derived in the above-described manner.

Now, the amount of carriers generated due to the oxygen donors in the silicon single crystal can be calculated by using the thus derived relational expression, and the silicon single crystal can be evaluated.

Further, since the amount of carriers generated can be obtained, a resistivity after the heat treatment can be estimated by an addition or a subtraction of carrier concentration calculated from the amount of carriers and the resistivity of the corresponding silicon single crystal.

Here, the addition or the subtraction is written because the calculation is dependent on an original conductivity type of the silicon single crystal. That is because the addition is used if the crystal is originally the N type or the subtraction is used if the crystal is originally the P type. Furthermore, when the amount of carriers generated due to the oxygen donors is higher than the carrier concentration of the P type, this situation is called N reversal, and the conductivity type is changed into the N type but, in this case, N type carrier concentration can be calculated by subtracting P type carrier concentration from carrier concentration due to oxygen donors. A relationship between the carrier concentration and the resistivity can be calculated by using the Irvin curve.

As described above, in regard to the silicon single crystal after the heat treatment, the resistivity can be calculated, and the evaluation can be performed.

As described above, according to the evaluation method of the present invention, in not only a situation where the oxygen concentration in the silicon single crystal is high but also a situation where the oxygen concentration is low (e.g., $9\times10^{17}$ atoms/cm³ (ASTM' 79) or less), the amount of carriers generated due to oxygen donors, further the resistivity after the heat treatment, and others can be appropriately evaluated as different from the prior art. It is possible to provide the evaluation method with the versatility as compared with the prior art.

A method for manufacturing silicon single crystal according to the present invention will now be described.

Such an evaluation method according to the present invention as shown in FIG. 1 will be first carried out.

Further, as described above, since an expected resistivity after a low-temperature heat treatment can be calculated, it is possible to determine oxygen concentration or a resistivity of a silicon wafer that is to be submitted to a corresponding process including this low-temperature heat treatment based on the calculated resistivity.

In the CZ method, crystal is grown after a dopant generally used for controlling resistance is put into the crucible and, at this time, the resistivity varies depending on a top side and a bottom side of the crystal due to a segregation phenomenon of the dopant. In case of shipment to a customer, a portion that meets a demand is shipped. Therefore, if a demanded resistivity range is narrow, a product length is short.

For example, in high-resistivity crystal of, e.g., approximately 500 Ωcm or more, carriers are generated due to oxygen donors by a low-temperature heat treatment that is performed in a wiring or packaging final process as described above, and the resistivity may be possibly different from that when the crystal is grown. Thus, when the present invention method is used, the oxygen concentration dependence of the carriers generated due to the oxygen donors can be easily obtained from a temperature and a time of the low-temperature heat treatment performed in the wiring or packaging final process. Therefore, the optimum resistivity and oxygen concentration can be freely designed.

Specifically, since $A_1$ atoms/cm$^3$ (ASTM' 79) is targeted as the oxygen concentration, the amount of carriers generated is $B_1$ atoms/cm$^3$, and hence a target resistivity can be set as $C_1$ Ωcm or a product portion is shortened. Alternatively, as a further developed form, since $A_2$ atoms/cm$^3$ (ASTM' 79) is targeted as the oxygen concentration and the growth is carried out on the top side of the crystal, the target resistivity can be set as $C_2$ Ωcm, or the oxygen concentration can be reduced to $A_2'$ atoms/cm$^3$ (ASTM' 79) on the crystal bottom side, and hence the product length can be freely designed to extend to $D_2$ cm.

A reason why low oxygen is required in high-resistivity crystal is that an influence of the oxygen donors on the resistivity is considerable, and the present invention method enables calculating the amount of carriers generated due to oxygen donors on the assumption of the expected low-temperature heat treatment in a device process or the like and controlling to the oxygen concentration or the resistivity that causes no problem even though a resistivity shift amount due to the amount of carriers generated is taken into consideration.

Target values of the oxygen concentration, the resistivity, and others at the time of growing silicon single crystal based on results of the evaluation carried out in advance or various conditions (the number of rotations of the crucible, an amount of a dopant, and others) required for achieving the target values can be determined so that desired quality can be finally obtained by performing the low-temperature heat treatment, and the silicon single crystal can be grown under the determined conditions by using such a single-crystal pulling apparatus 1 as shown in FIG. 2.

Moreover, a desired silicon wafer can be obtained through an originally planned process.

It is to be noted that the high-resistivity crystal of 50 Ωcm or more was taken as an example since its resistivity changes by a small amount of carriers generated due to oxygen donors, but the present invention is not restricted thereto. As can be understood from the relational expression, when oxygen concentration is high or a treatment time is long, an amount of carriers generated greatly increases, and hence an influence appears even in a resistivity range that is sufficiently lower than 50 Ωcm. Therefore, the present invention method can be applied to any resistivity range, which is desirable.

EXAMPLES

The present invention will now be more specifically explained hereinafter based on examples and a comparative example, but the present invention is not restricted thereto.

Example 1

In addition to the samples used in the experiment 2, low-oxygen concentration samples each having oxygen concentration of 2.9 to 8.9×10$^{17}$ atoms/cm$^3$ (ASTM' 79) were prepared. Samples of not only the P type but also the N type are included.

In regard to these samples, an amount of carriers generated due to oxygen donors was calculated and evaluated by using the relational expression (Expression (2) in this case) in the present invention.

The evaluation was carried out in regard to a situation where heat treatment times were one hour and 15 hour at 450° and also a situation where the heat treatment times were five hours and 10 hours.

Figure 4:
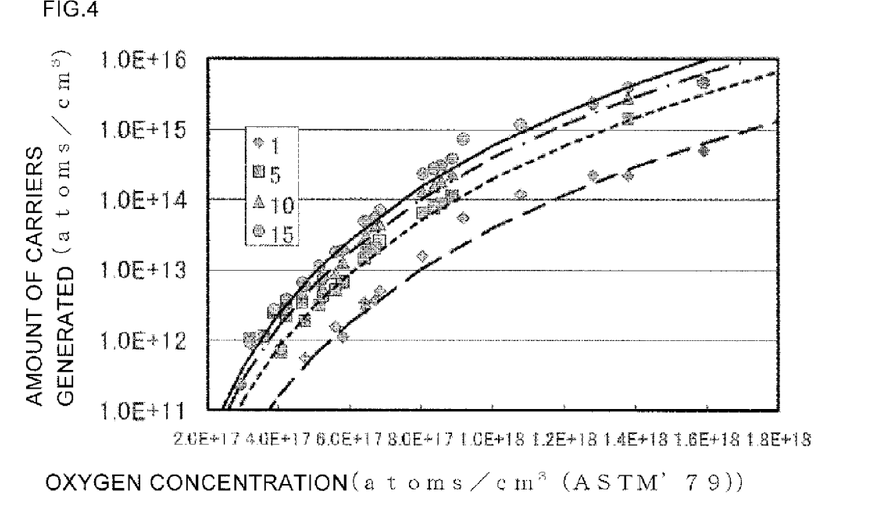
FIG. 4 is a graph showing a relationship between oxygen concentration and an amount of carriers generated in Example 1 and a relational expression according to the present invention.

FIG. 4 shows a graph obtained from the relational expression in accordance with each heat treatment time.

Additionally, whether the graph of the amount of carriers generated that was obtained as described above was appropriate was confirmed by actually carrying out the heat treatment.

It is to be noted that, in case of each N-type sample, the amount of carriers generated was obtained by subtracting carrier concentration calculated with the use of a resistivity before the heat treatment from carrier concentration calculated with the use of a resistivity after the heat treatment.

These results were plotted in FIG. 4. It can be found out from FIG. 4 that Expression (2) can excellently represent the experimental results even though the heat treatment time is changed. Further, in both the P type and the N type, it can be understood that this expression can be used without problem.

Example 2

A wafer that is the P type and has a resistivity of 1000 Ωcm to 2000 Ωcm was demanded. Furthermore, a low-temperature heat treatment carried out in this last device stage is a process corresponding to 450° C. and two hours. Thus, examinations were conducted to achieve this object.

Crystal was manufactured based on the MCZ method, and crystal growth was effected with the use of an apparatus in which a crucible has a size of 26 inches (66 cm).

As described above, the oxygen concentration on the crystal top side is hardly lowered. For example, when a situation where 4×10$^{17}$ atoms/cm$^3$ (ASTM' 79) is targeted as the oxygen concentration [Oi] is compared with a situation where 8×10$^{17}$ atoms/cm$^3$ (ASTM' 79) is targeted as the same, a failure rate of the oxygen concentration in the target value 4×10$^{17}$ atoms/cm$^3$ (ASTM' 79) doubles or triples that in the target value 8×10$^{17}$ atoms/cm$^3$ (ASTM' 79), resulting in an increase in cost. Therefore, the failure rate is lowered as the target oxygen concentration is increased, thereby reducing the cost. However, when the oxygen concentration is increased, carriers due to oxygen donors are generated, and a desired resistivity cannot be obtained.

Thus, a trial calculation was performed with the use of the relational expression (Expression (2) in this case) in the present invention.

Figure 5:
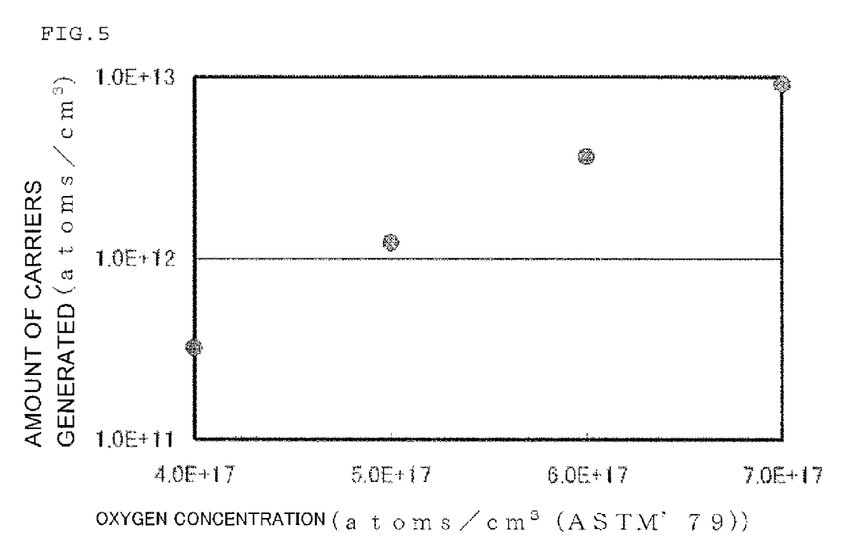
FIG. 5 is a graph showing an amount of carriers generated due to oxygen donors produced by a heat treatment performed at 450° C. for two hours in Example 2.

First, an amount of carriers generated due to oxygen donors that are produced by a heat treatment performed at 450° C. for two hours is calculated by using Expression (2), and FIG. 5 shows results. As shown in FIG. 5, the trial calculation was carried out with respect to each of cases where the oxygen concentration [Oi] is 4×10$^{17}$, 5×10$^{17}$, 6×10$^{17}$, and 7×10$^{17}$ atoms/cm$^3$ (ASTM' 79).

Figure 6:
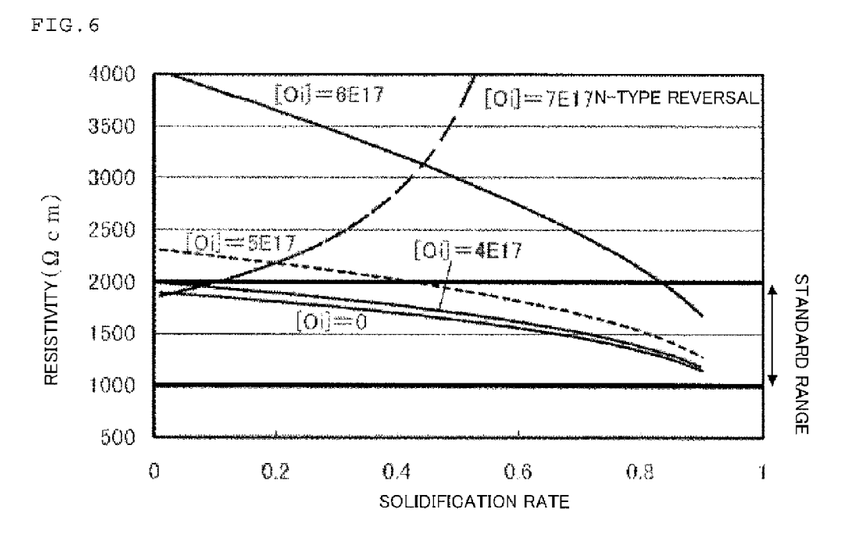
FIG. 6 is a graph in which a resistivity distribution after a heat treatment performed at 450° C. for two hours is estimated in accordance with each oxygen concentration in Example 2.

Furthermore, based on the amount of carriers generated that was obtained from the trial calculation in each of situations where the oxygen concentrations [Oi] are 4×10$^{17}$, 5×10$^{17}$, 6×10$^{17}$, and 7×10$^{17}$ atoms/cm$^3$ (ASTM' 79) and the oxygen concentration [Oi] is 0 atoms/cm$^3$ (ASTM' 79), a resistivity distribution in a crystal length direction when carriers were generated due to oxygen donors after the low-temperature heat treatment was plotted in FIG. 6 in accordance with each oxygen concentration.

In FIG. 6, a horizontal axis represents a solidification rate of crystal (=a crystal weight/an initial starting material weight).

It is to be noted that, to achieve the object, the target resistivity on the crystal top side was set to 1900 Ωcm. The resistivity of the crystal is high on the top side and low on the bottom side due to the segregation phenomenon of the dopant. Therefore, a target resistivity on the top side is a value close to a higher value in the standard range of 1000 to 2000 Ωcm. However, it is general to take a targeting accuracy into consideration and target a value slightly lower than a standard upper limit value. Thus, the target resistivity on the top side was set to be 1900 Ωcm in this example.

It can be easily expected from this graph in FIG. 6 that no problem occurs even after the device process if growth is carried out while targeting $4\times10^{17}$ atoms/cm$^3$ (ASTM' 79) as the oxygen concentration [Oi].

It can be easily determined that approximately a half of the whole is not suitable for the standard after the device process if the value $5\times10^{17}$ atoms/cm$^3$ (ASTM' 79) is targeted as the oxygen concentration [Oi] and that an approximately all amount is not suitable for the standard if the values $6\times10^{17}$ and $7\times10^{17}$ atoms/cm$^3$ (ASTM' 79) are targeted.

Example 3

Like Example 2, a low-temperature heat treatment carried out in the final device stage corresponds to a treatment performed at 450° C. for two hours, and a P-type wafer having a resistivity of 1000 Ωcm to 2000 Ωcm was demanded.

First, it was suggested from the graph in FIG. 6 according to Example 2 that, to obtain a wafer having a resistivity falling within the standard range, targeting $4\times10^{17}$ atoms/cm$^3$ (ASTM' 79) as the oxygen concentration [Oi] at the time of growth of silicon single crystal can suffice. It can be considered that, if the silicon single crystal is grown with this oxygen concentration and the low-temperature heat treatment process is carried out, crystal having a resistivity when the oxygen concentration [Oi] in FIG. 6 is $4\times10^{17}$ atoms/cm$^3$ (ASTM' 79) can be obtained.

However, if achieving this low-oxygen concentration on the crystal top side is tried, for example, there occurs a problem that a surface of the melt is partially solidified to obstruct crystal growth and single crystal is hard to obtain.

Figure 7:
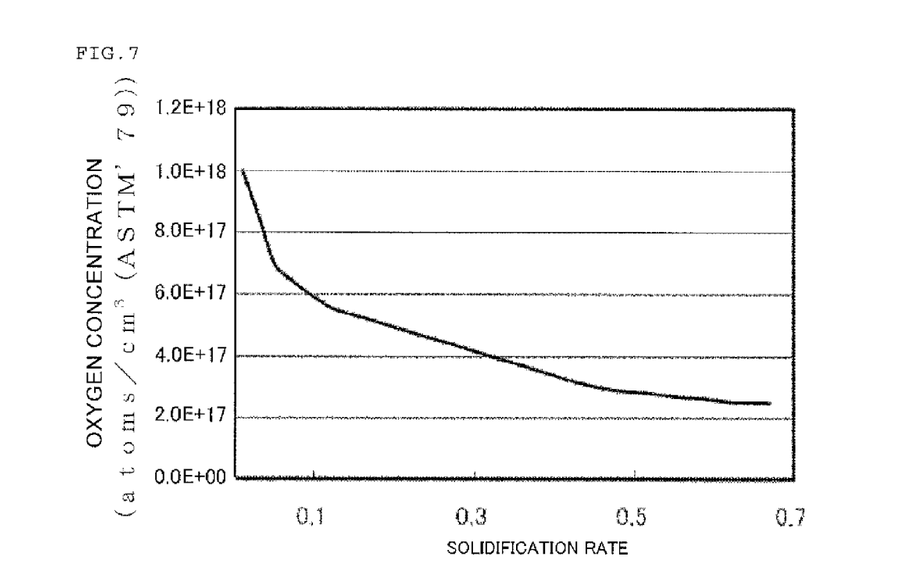
FIG. 7 is a graph showing an oxygen concentration profile in each of Example 3 and Comparative Example.

Thus, in this example, based on FIG. 6, a resistivity that should be targeted is determined from the oxygen concentration in case of growing crystal under conditions that enable naturally lowering the oxygen concentration, and design that can assure a larger amount of a product is carried out. When the same manufacturing apparatus as that in Example 2 was used and lowering the oxygen concentration is intended under realistic conditions, such an oxygen concentration profile as shown in FIG. 7 can be obtained.

Figure 8:
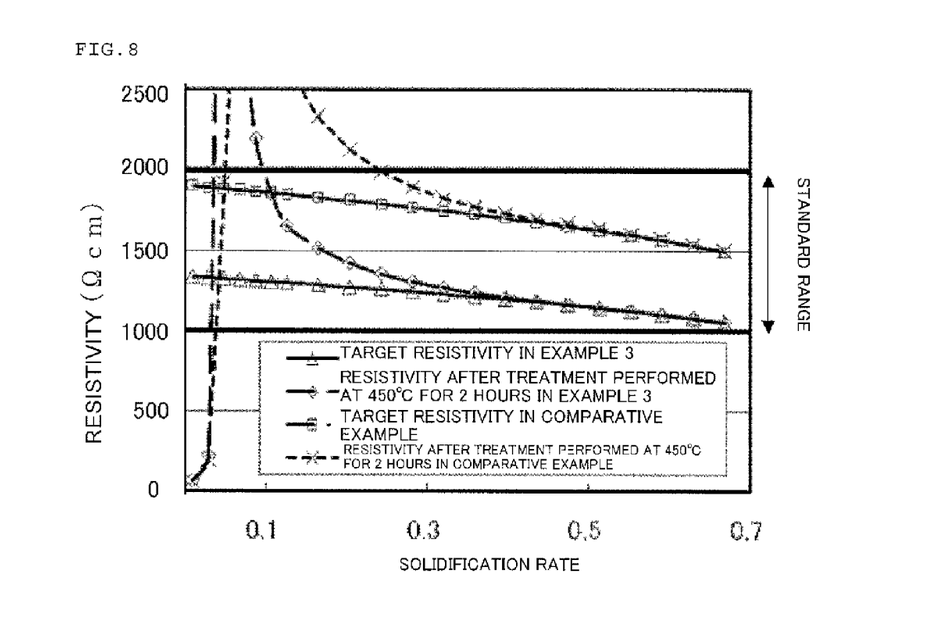
FIG. 8 is a graph showing an estimated resistivity distribution in each of Example 3 and Comparative Example.

Further, based on the oxygen concentration profile in the silicon single crystal, a trial calculation of an amount of carriers generated due to oxygen donors after at 450° C. for two hours was performed, this generation amount was subtracted, and a target resistivity on the top side was designed so that a resistivity on the bottom side could become 1000Ω or more as a standard lower limit value and also become 1050 Ωcm while considering a targeting error. FIG. 8 shows this result by using a solid line.

As a result of the above-described consideration, the resistivity that should be targeted is approximately 1350 Ωcm on the top side. Moreover, an amount of carriers generated that could be calculated from the oxygen concentration was taken into consideration, and a resistivity that could be expected after the device process was also shown in FIG. 8 in the form of a broken line.

As shown in this FIG. 8, the resistivity after the device process falls within the standard range when the solidification rate reaches approximately 0.11, and the design that a product is effective until the solidification rate is 0.11 to 0.7 was made.

Further, the silicon single crystal was grown based on this design. Furthermore, each wafer-shaped sample was sliced out from the grown crystal, a donor killer heat treatment was performed, and a resistivity was measured. As a result, the resistivity that coincided with the solid line in FIG. 8 was obtained.

A simulation heat treatment simulating a device was performed with respect to each of these samples at 450° C. for two hours as a final process, and then the resistivity was again measured.

As a result, a profile of the resistivity coincided with the broken line in FIG. 8 corresponding to a resistivity profile that is obtained from Expression (2) and expected after the device heat treatment. Moreover, as a result of submitting each product wafer sliced out from (an entire region of) each of these crystal pieces to an actual device process and evaluating it, it was confirmed that a device operation had no problem.

Comparative Example

Crystal was determined to grow without using the present invention method with respect to the same demand as Example 3.

Since the resistivity standard is 1000 Ωcm to 2000 Ωcm, a target resistivity was determined so as to achieve 1900 Ωcm on the top side of the crystal without considering an amount of carriers generated due to oxygen donors. Each resistivity calculated from this target was shown in the form of an alternate long and short dash line in FIG. 8.

Additionally, the oxygen concentration was determined to have the same profile as that in Example 3.

Like Example 3, each wafer-shaped sample was sliced out from the crystal grown under such conditions, a donor killer heat treatment was performed, and a resistivity was measured.

As a result, a resistivity profile substantially coinciding with the alternate long and short dash line in FIG. 8 was obtained. At this point in time, the resistivity standard of 1000 to 2000 Ωcm is met, and an accepted product was provided.

However, a simulating heat treatment simulating a device was performed with respect to a wafer sliced out from this crystal at 450° C. for two hours as a final process, and then a resistivity was measured.

As a result, the resistivity profile showed a distribution equivalent to a dotted line in FIG. 8 corresponding to the resistivity profile that is obtained from Expression (2) and expected after the device heat treatment.

That is, as a result of growing the crystal without considering the amount of carriers generated due to oxygen donors, the solidification rate of a product length meeting the standard even after the device process reached 0.25 to 0.7, and the product length was reduced as compared with 0.11 to 0.7 provided by Example 3.

It is to be noted that the present invention is not restricted to the foregoing embodiments. The foregoing embodiments are just illustrative examples, and any example that has substantially same configuration and exercises the same functions and effects as the technical concept described in claims of the present invention is included in the technical scope of the present invention.

The invention claimed is:

1. A method for evaluating silicon single crystal wherein an amount Δ[C] of carriers generated due to oxygen donors produced when a heat treatment is performed to the silicon single crystal is calculated and evaluated, the amount $\Delta[C]$ being calculated from oxygen concentration [Oi] in the silicon single crystal, a temperature T of the heat treatment, a time t of the heat treatment, and an oxygen diffusion coefficient D(T) at the temperature T by using the following relational expression:

$$\Delta[C] = \alpha[Oi]^5 \times \exp(-\beta \cdot D(T) \cdot [Oi] \cdot t)$$

(where $\alpha$ and $\beta$ are constants).

2. The method for evaluating silicon single crystal according to claim 1, wherein the oxygen concentration in the silicon single crystal to be evaluated is set to $9 \times 10^{17}$ atoms/cm$^3$ (ASTM' 79) or less.

3. The method for evaluating silicon single crystal according to claim 2, wherein an amount of carriers generated due to oxygen donors is calculated by using the relational expression, and a resistivity of the silicon single crystal after the heat treatment is calculated by using the calculated amount of carriers generated and is evaluated.

4. A method for manufacturing silicon single crystal wherein a resistivity of the silicon single crystal after the heat treatment is calculated by using the method for evaluating silicon single crystal according to claim 3, target values of oxygen concentration and a resistivity at the time of growing the silicon single crystal are determined based on the calculated resistivity, and the silicon single crystal is grown based on the determined target values.

5. The method for evaluating silicon single crystal according to claim 1, wherein an amount of carriers generated due to oxygen donors is calculated by using the relational expression, and a resistivity of the silicon single crystal after the heat treatment is calculated by using the calculated amount of carriers generated and is evaluated.

6. A method for manufacturing silicon single crystal wherein a resistivity of the silicon single crystal after the heat treatment is calculated by using the method for evaluating silicon single crystal according to claim 5, target values of oxygen concentration and a resistivity at the time of growing the silicon single crystal are determined based on the calculated resistivity, and the silicon single crystal is grown based on the determined target values.

* * * * *